(12) United States Patent
Wang et al.

(10) Patent No.: US 8,772,885 B2
(45) Date of Patent: Jul. 8, 2014

(54) MEMS SENSING DEVICE AND METHOD FOR THE SAME

(71) Applicants: Chuan-Wei Wang, Hsin-Chu (TW); Ming-Han Tsai, Hsin-Chu (TW)

(72) Inventors: Chuan-Wei Wang, Hsin-Chu (TW); Ming-Han Tsai, Hsin-Chu (TW)

(73) Assignee: PixArt Imaging Incorporation, R.O.C., Hain-Chu (TW)

( * ) Notice: Subject to any disclaimer, the term of this patent is extended or adjusted under 35 U.S.C. 154(b) by 0 days.

(21) Appl. No.: 13/948,128

(22) Filed: Jul. 22, 2013

(65) Prior Publication Data

US 2013/0334623 A1 Dec. 19, 2013

Related U.S. Application Data

(62) Division of application No. 13/134,262, filed on Jun. 3, 2011, now Pat. No. 8,519,491.

(30) Foreign Application Priority Data

Mar. 30, 2011 (TW) .............................. 100111075 A (51) Int. Cl.
*H01L 29/84* (2006.01)
(52) U.S. Cl.
USPC ............. 257/416; 257/47; 257/418; 257/419; 438/48; 438/421; 438/637

(58) Field of Classification Search
None
See application file for complete search history.

(56) References Cited

U.S. PATENT DOCUMENTS

| 2009/0108381 A1* | 4/2009 | Buchwalter et al. ........... 257/415 |
| 2011/0121412 A1* | 5/2011 | Quevy et al. .................. 257/415 |
| 2012/0119311 A1* | 5/2012 | Akhlaghi Esfahany et al. .............................. 257/415 |

* cited by examiner

*Primary Examiner* — Steven Loke
*Assistant Examiner* — Cuong B Nguyen
(74) *Attorney, Agent, or Firm* — Tung & Associates (57) ABSTRACT

The present invention discloses a MEMS sensing device which comprises a substrate, a MEMS device region, a film, an adhesive layer, a cover, at least one opening, and a plurality of leads. The substrate has a first surface and a second surface opposite the first surface. The MEMS device region is on the first surface, and includes a chamber. The film is overlaid on the MEMS device region to seal the chamber as a sealed space. The cover is mounted on the MEMS device region and adhered by the adhesive layer. The opening is on the cover or the adhesive layer, allowing the pressure of the air outside the device to pressure the film. The leads are electrically connected to the MEMS device region, and extend to the second surface.

8 Claims, 10 Drawing Sheets

MEMS SENSING DEVICE AND METHOD FOR THE SAME

CROSS REFERENCE

This is a Divisional Application of U.S. patent application Ser. No. 13/134,262, filed on Jun. 3, 2011.

BACKGROUND OF THE INVENTION

1. Field of Invention

The present invention relates to a Micro-Electro-Mechanical System (MEMS) sensing device and a method for making the MEMS sensing device, in particular to such MEMS sensing device and method wherein a packaging process is integrated in the manufacturing process for making the device.

2. Description of Related Art

MEMS devices are miniature devices integrating electrical and mechanical functions, and often made by semiconductor processes. Typical commercial products of such devices include pressure sensors, accelerators, gyroscopes, optical telecom devices, digital light processors (DLPs), inkjet heads, RF sensing devices for wireless network and so on. They are applied to vehicle tire pressure gauges, optical telecom networks, projectors, sensing networks, digital microphones, clock oscillators, interactive gamers and several other kinds of products. The MEMS devices also play major roles even in many developed researches of new generation memory techniques, biochips, display techniques, and emerging energies.

Figure 1:
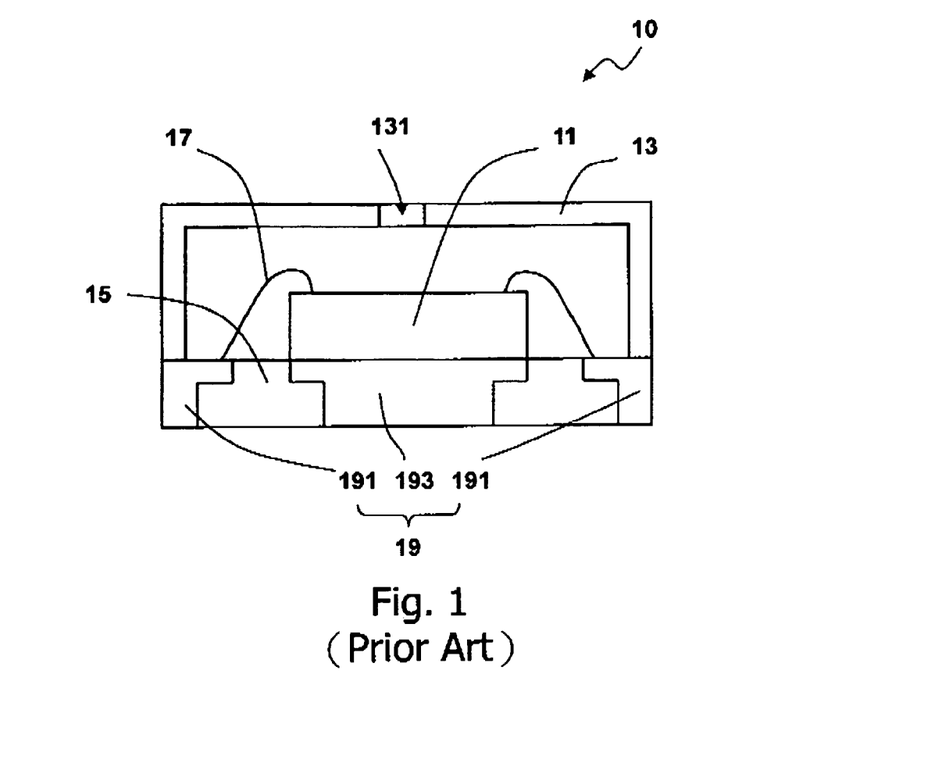
FIG. 1 shows a cross-sectional diagram of a prior art pressure sensor.

Traditional MEMS chips require complicated assembling (or packaging) processes, such as QFN (Quad Flat No leads) or LGA (Land Grid Array), so that they can be applied to and combined in the foregoing products. FIG. 1 shows a cross-sectional diagram of a prior art pressure sensor. As shown in FIG. 1, the pressure sensor 10 comprises a MEMS chip 11, a packaging housing 13, an insulating adhesive 15, a plurality of bonding wires 17 and a QFN leadframe 19. The MEMS chip 11 is mounted on the die pad 193 of the QFN leadframe 19, and is electrically connected to the contacts 191 of the QFN leadframe 19 through the bonding wires 17. The packaging housing 13 covers the MEMS chip 11, and is bonded with the QFN leadframe 19. The through hole 131 of the packaging housing 13 allows external air outside the pressure sensor 10 to directly pressure the MEMS chip 11, so that the external air pressure can be measured. However, manufacturing such QFN or LGA type MEMS devices require complicated packaging processes and multiple materials some of which are not commonly used in a typical CMOS semiconductor process. Thus, the cost is undesirably high.

In view of above disadvantages, the present invention provides a method for making a MEMS sensing device that integrates a wafer level packaging process after a CMOS process, so that the packaging process is simplified and the manufacturing cost is also reduced.

For reference, the following patents disclose contents related to the present application: U.S. Pat. Nos. 6,012,336, 6,536,281, 6,928,879, 7,121,146, 6,743,654, and 7,135,749.

SUMMARY OF THE INVENTION

An objective of the present invention is to provide a method for making a MEMS sensing device into which a packaging process is integrated. Another objective of the present invention is to provide a MEMS sensing device.

To achieve the foregoing objectives, in one aspect, the present invention provides a MEMS sensing device, comprising: a substrate having a first surface and a second surface opposite the first surface; a MEMS device region on the first surface of the substrate, the MEMS device region including a chamber; a film overlaid on the MEMS device region to seal the chamber as a sealed space; an adhesive layer; a cover mounted on the MEMS device region and adhered by the adhesive layer; and a plurality of leads electrically connected to the MEMS device region and extending to the second surface.

In one embodiment, the MEMS sensing device further comprises at least one opening on the cover or the adhesive layer.

In one embodiment, the MEMS device region includes a variable capacitor whose capacitance is changeable according to air pressure acting on the film.

In one embodiment, the plurality of leads are a plurality of TSVs (Through Silicon Vias) through the substrate.

In one embodiment, the leads are a plurality of T contacts.

In one embodiment, the opening allows external air outside the MEMS sensing device to pressure the film.

In another aspect, the present invention provides a method for making a MEMS sensing device, comprising: proving a substrate, wherein the substrate includes a first surface and a second surface opposite the first surface; forming a multilayer structure including a plurality of metal layers and an insulating region on the first surface of the substrate; removing a portion of the insulating region to form a chamber; providing a mask layer on the multilayer structure to form a MEMS device region; overlaying a film on the mask layer to seal the chamber as a sealed space; adhering a cover on the MEMS device region by an adhesive layer; forming a plurality of leads on the substrate, wherein the leads are connected to the MEMS device region and extend to the second surface; and forming at least one opening on the cover.

In one embodiment, the leads are a plurality of TSVs through the substrate.

In one embodiment, the leads are a plurality of T contacts.

In one embodiment, the opening allows external air outside the MEMS sensing device to pressure the film.

In another aspect, the present invention provides a method for making a MEMS sensing device, comprising: proving a substrate, wherein the substrate includes a first surface and a second surface opposite the first surface; forming a multilayer structure including a plurality of metal layers and an insulating region on the first surface of the substrate; forming a mask layer on the multilayer structure; removing a portion of the insulating region to form a chamber and make the multilayer structure become a MEMS device region; overlaying a film on the mask layer to seal the chamber as a sealed space; adhering a cover on the MEMS device region by an adhesive layer, wherein the adhesive layer has at least one opening; and forming a plurality of leads on the substrate, wherein the leads are connected to the MEMS device region and extend to the second surface.

In one embodiment, the leads are a plurality of TSVs through the substrate.

In one embodiment, the leads are a plurality of T contacts.

In one embodiment, the opening allows external air outside the MEMS sensing device to pressure the film.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustration only, to show the interrelationships between the process steps and between the layers of MEMS sensing devices, but not drawn according to actual scale.

Figure 2A:
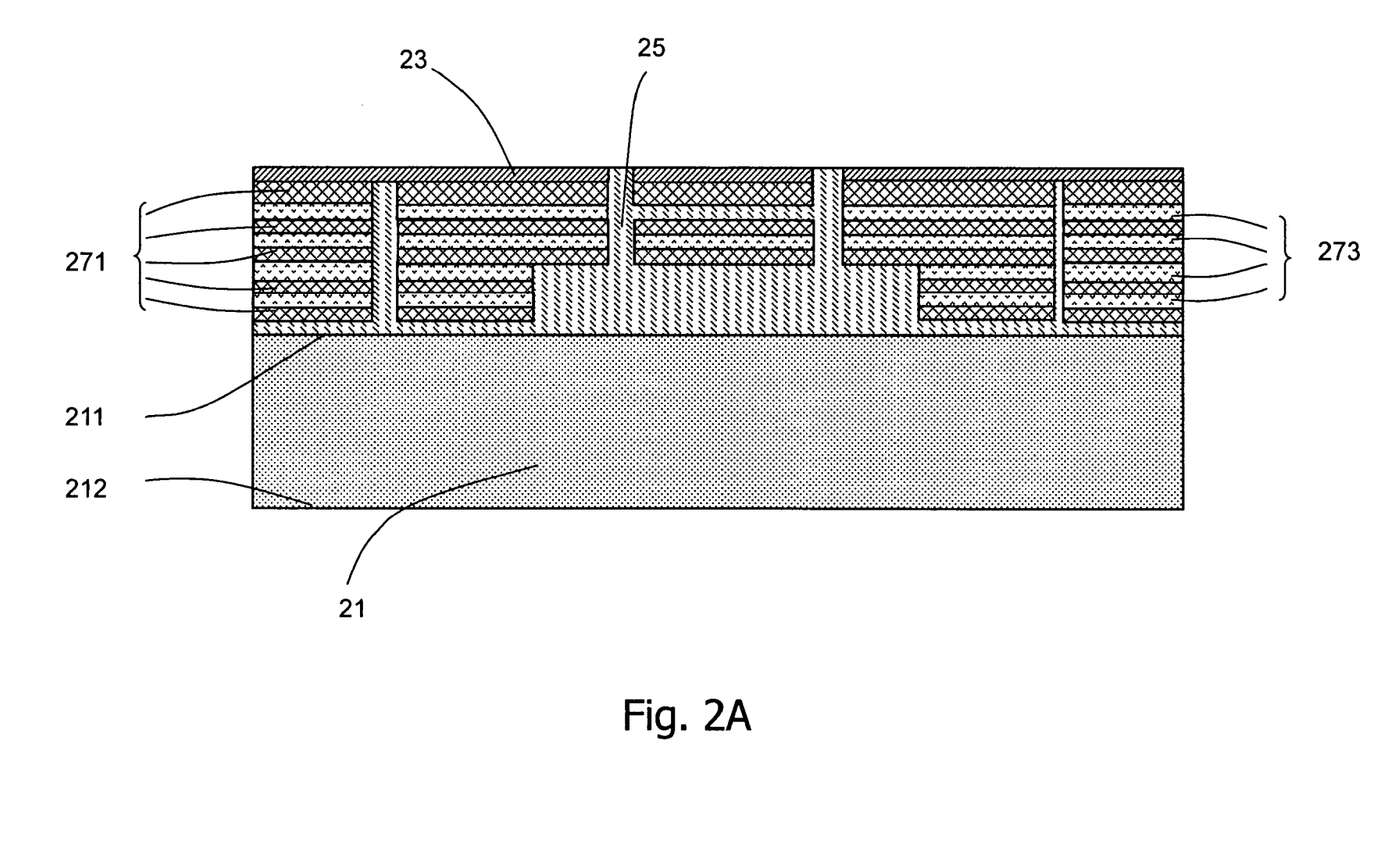
FIGS. 2A-2G are cross-sectional diagrams showing a manufacturing process for making a MEMS sensing device according to a first embodiment of the present invention.

FIGS. 2A-2G are cross-sectional diagrams showing a manufacturing process for making a MEMS sensing device according to a the first embodiment of the present invention. As shown in FIG. 2A, a substrate 21 is provided, which may be, for example but not limited to, a silicon substrate. A multilayer structure including a plurality of metal layers (e.g. substantially made of aluminum) 271, a plurality of via layers (e.g. substantially made of tungsten) 273, and an insulating region 25 (e.g. substantially made of silicon oxide) is formed on the first surface of the substrate 21. A hard mask layer 23 is formed on the multilayer structure. The material of the hard mask layer 23 should be resistive to the etch of the insulating region 25. For example, if the insulating region 25 is silicon oxide and the etch is performed by HF vapor, options of the hard mask layer 23 include nitrides (silicon nitride, titanium nitride, etc.) and metal materials (including copper, aluminum, tungsten, titanium, etc., and alloys thereof), or other materials that can resist the HF vapor etch. The above materials are just listed as examples, and if the insulating region 25 is another material, the material of the hard mask 23 should be correspondingly selected. The foregoing steps are compatible to a general CMOS process. Note that the multilayer structure is not limited to what is shown but can include different number of layers, different metal materials and insulating materials, different sequences of the layers and different patterns. The substrate 21 includes a second surface 212 opposite the first surface 211.

Figure 2B:
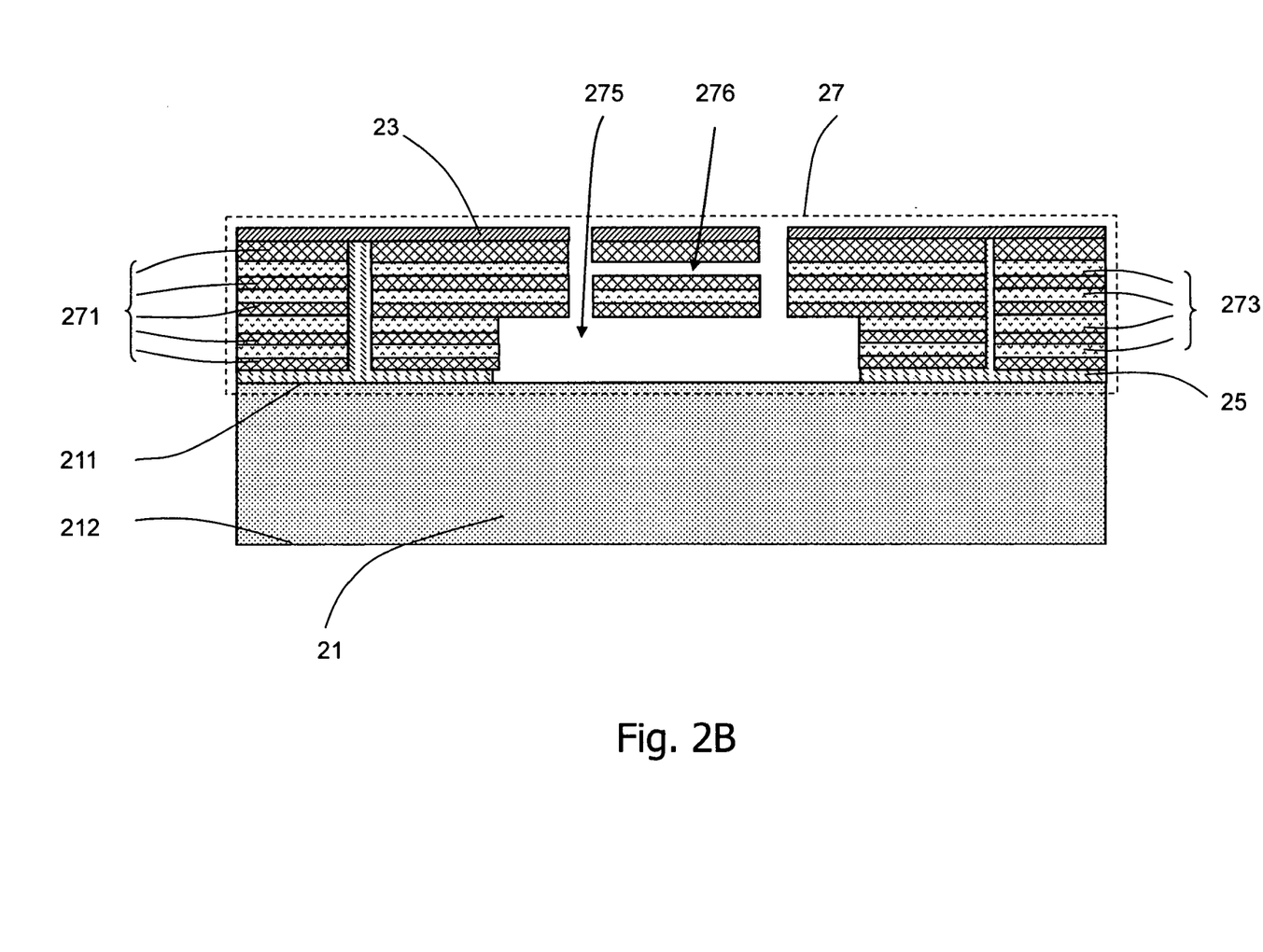

The hard mask layer 23 (which is made of an etch-resistive metal or insulating material as described above) has a defined pattern for the following etch process. As shown in FIG. 2B, a portion of the insulating region 25 is removed by the etch process to form a chamber 275 and the movable electrode 276 of a variable capacitor. After etch, the multilayer structure is released to become a MEMS device region 27. (The fixed electrode of the variable capacitor is not shown in this figure.) In this embodiment, when the pressure of the chamber 275 changes, the movable electrode 276 moves accordingly so that the capacitance of the variable capacitor is varied. Note that to detect pressure change is only one among many possible applications; the MEMS device region of the present invention also can be an acceleration sensor or a sensor for other sensing purposes. When the capacitance of the variable capacitor is changed by movement or pressure, the movement or pressure can be measured and converted to an electronic signal by calculating the capacitance change. The etch process for removing the insulating region 25 for example can be HF vapor etch.

Figure 2C:
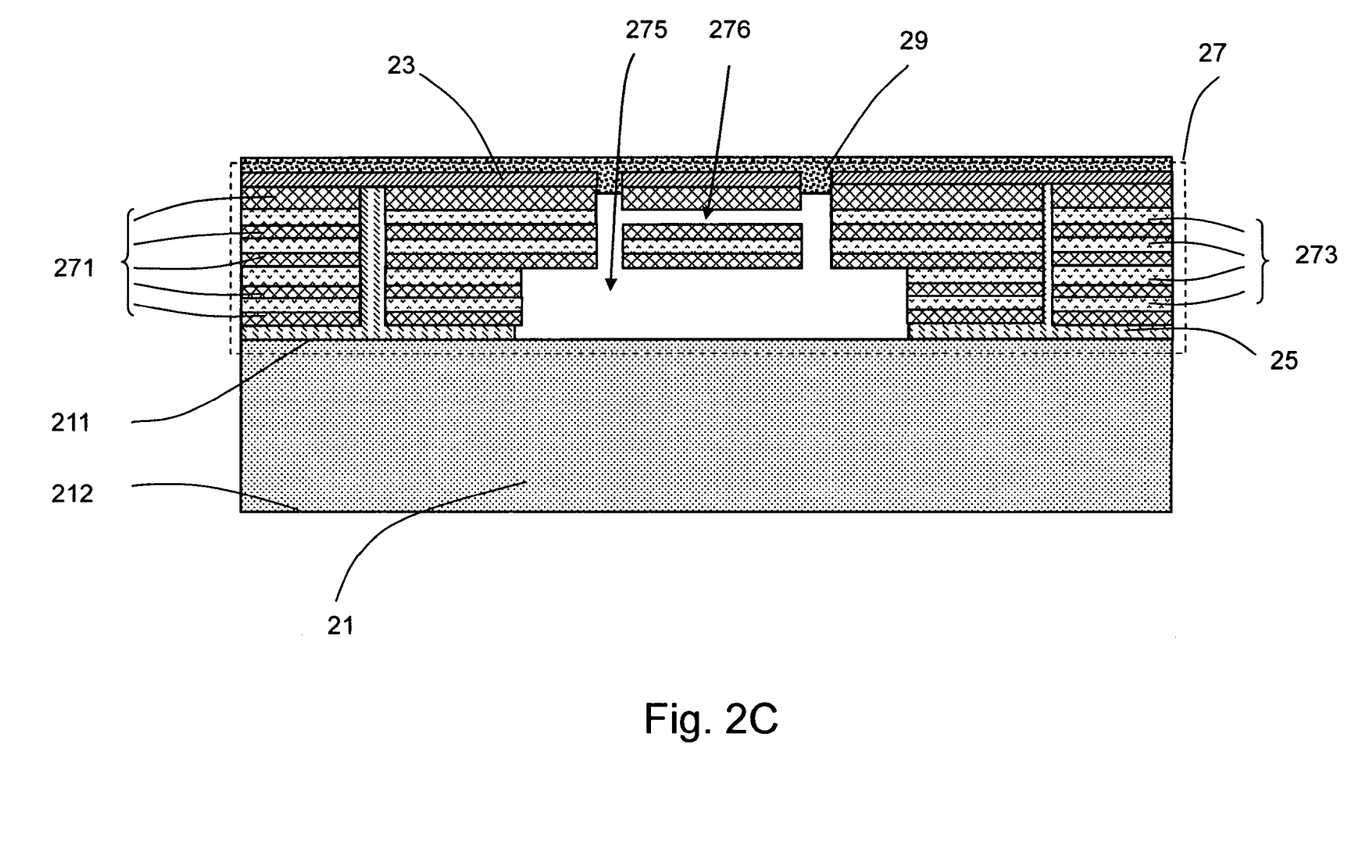
Figure 2D:
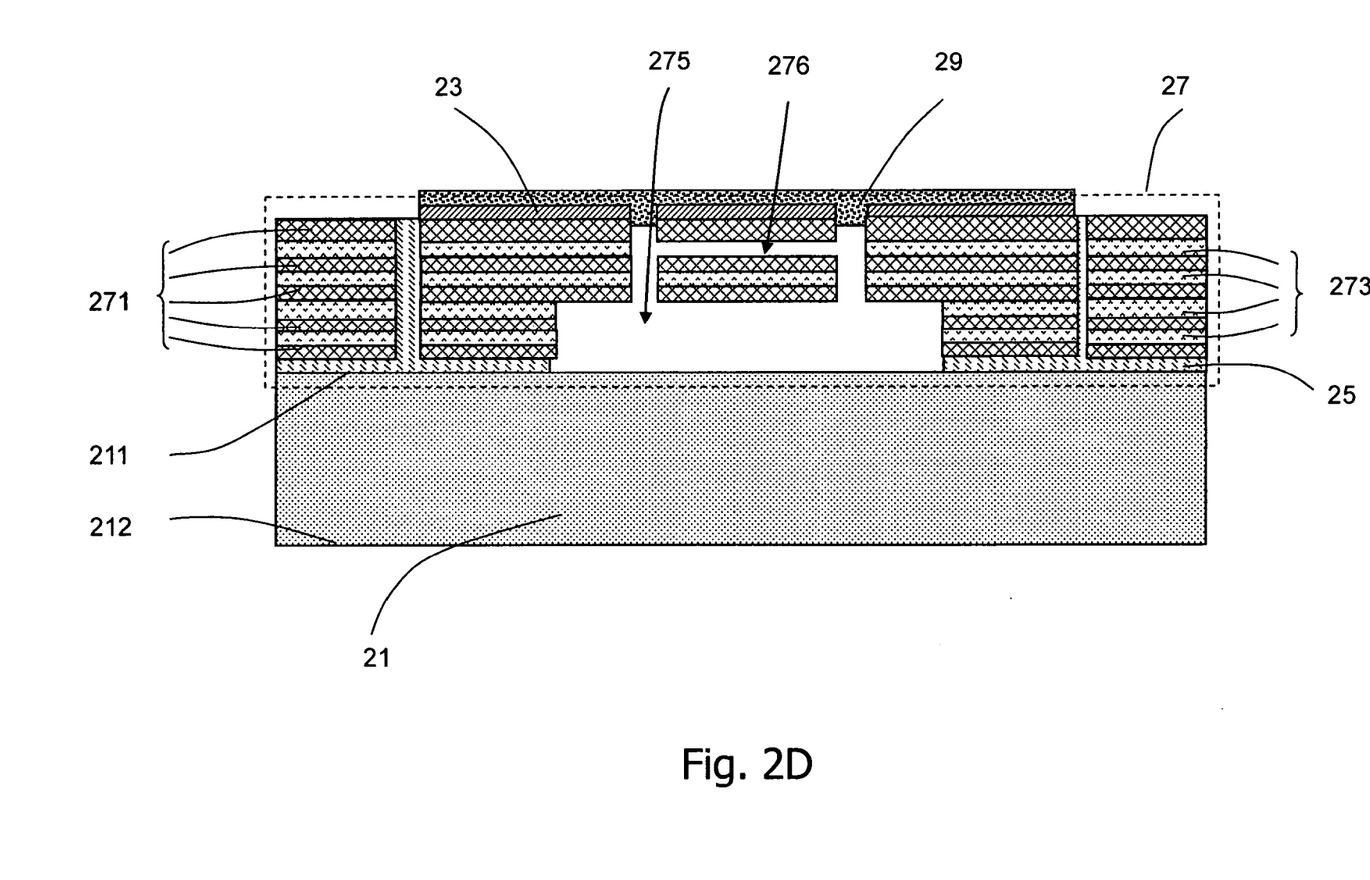

Referring to FIG. 2C, a film 29 is overlaid on the hard mask layer 23 to seal the chamber 25 as a sealed space. The film 29 is for example a metal layer, formed on the surface of the hard mask layer 23 by a metal deposition process, and closing the opening connecting the chamber 275 to the external. Thereafter, portions of the film 29 and the hard mask layer 23 are removed to expose the outer portions of the topmost metal layer 271, as shown in FIG. 2D. This removal step is for avoiding short-circuit, so if the hard mask layer 23 is an insulating material layer, the removal step can be omitted. However if a T contact (referring to FIG. 3) is to be formed later, then the removal step is still necessary.

Figure 2E:
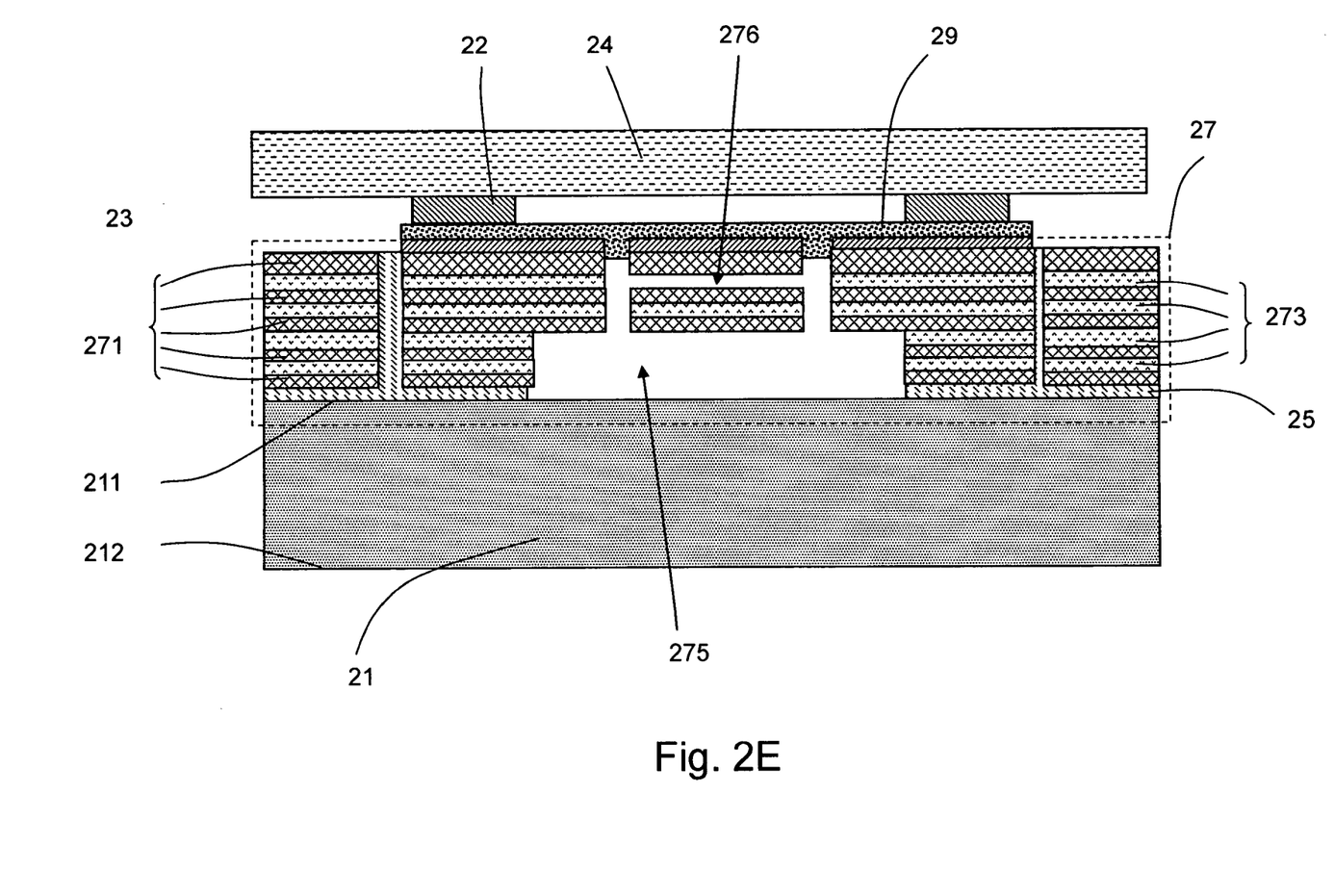
Figure 2F:
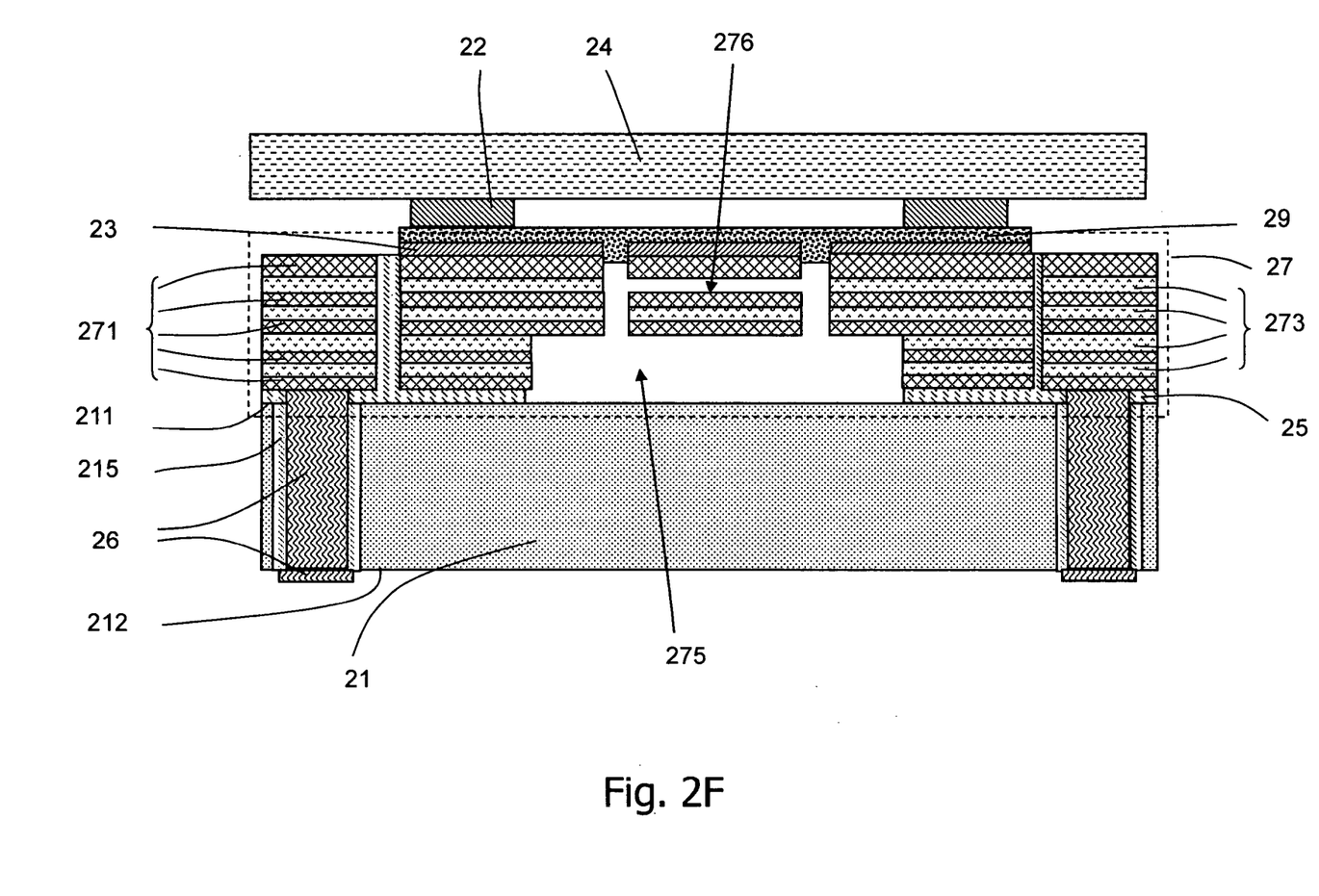

As shown in FIG. 2E, a cover 24 is adhered on the MEMS device region 27 by an adhesive layer 22. The pattern or configuration of the adhesive layer 22 is not limited to what is shown in the embodiment. A plurality of TSVs (Through Silicon Vias) 26 are formed on the second surface 213 and through the substrate 21, as shown in FIG. 2F. An insulating layer (e.g. substantially made of silicon oxide) 215 is provided between the TSVs 26 and the substrate 21 to insulate the TSVs 26 from the substrate 21.

Figure 2G:
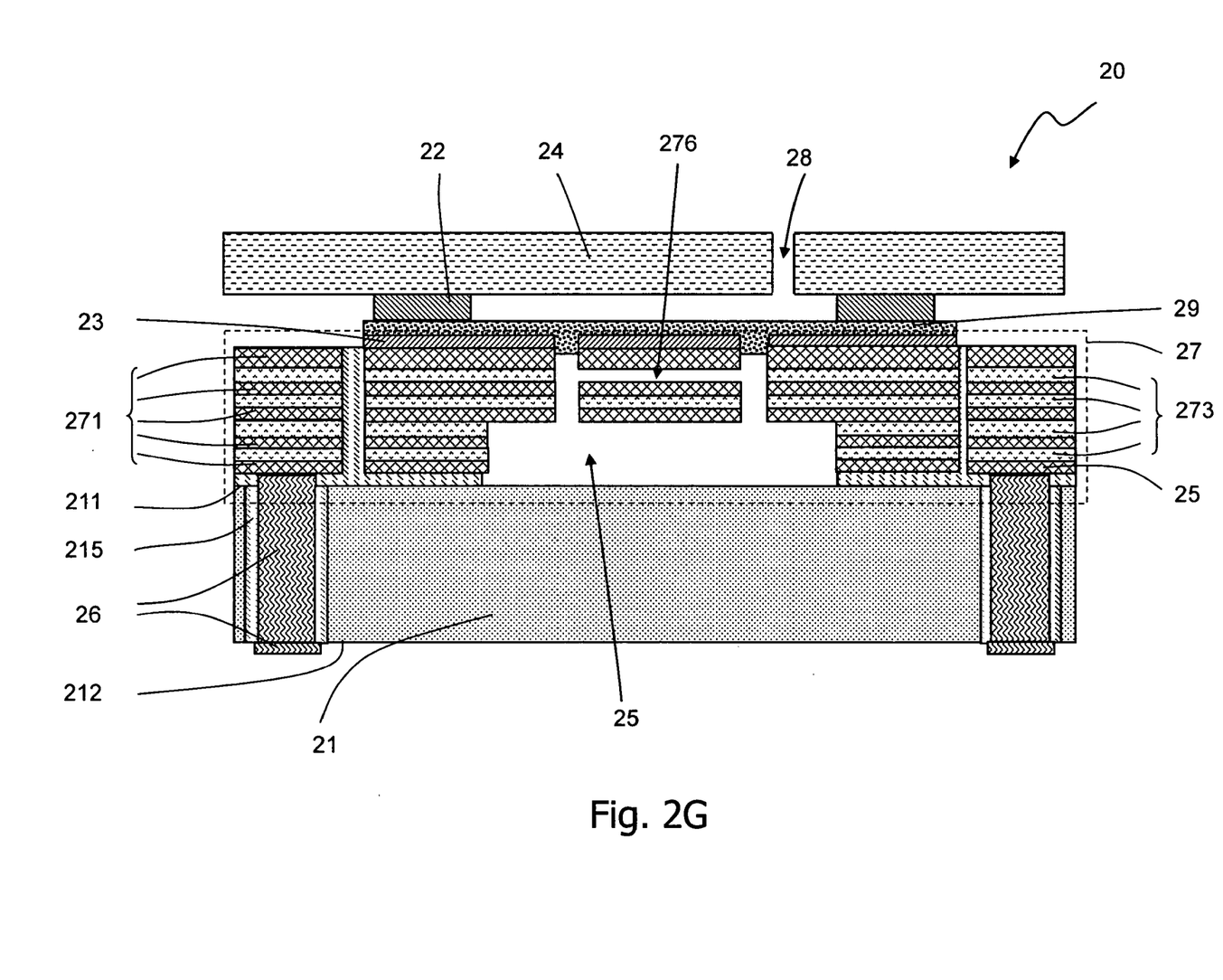

As shown in FIG. 2G, at least one opening 28 is formed on the cover 24. Through the opening 28, the external air can pressure the film 29 on the MEMS device region 27 so that the MEMS sensing device 20 can measure the pressure applied by the external air. Alternatively, the opening 28 can be formed on the cover 24 in advance, before the adhesion of the cover 24 on the MEMS device region 27.

Figure 3:
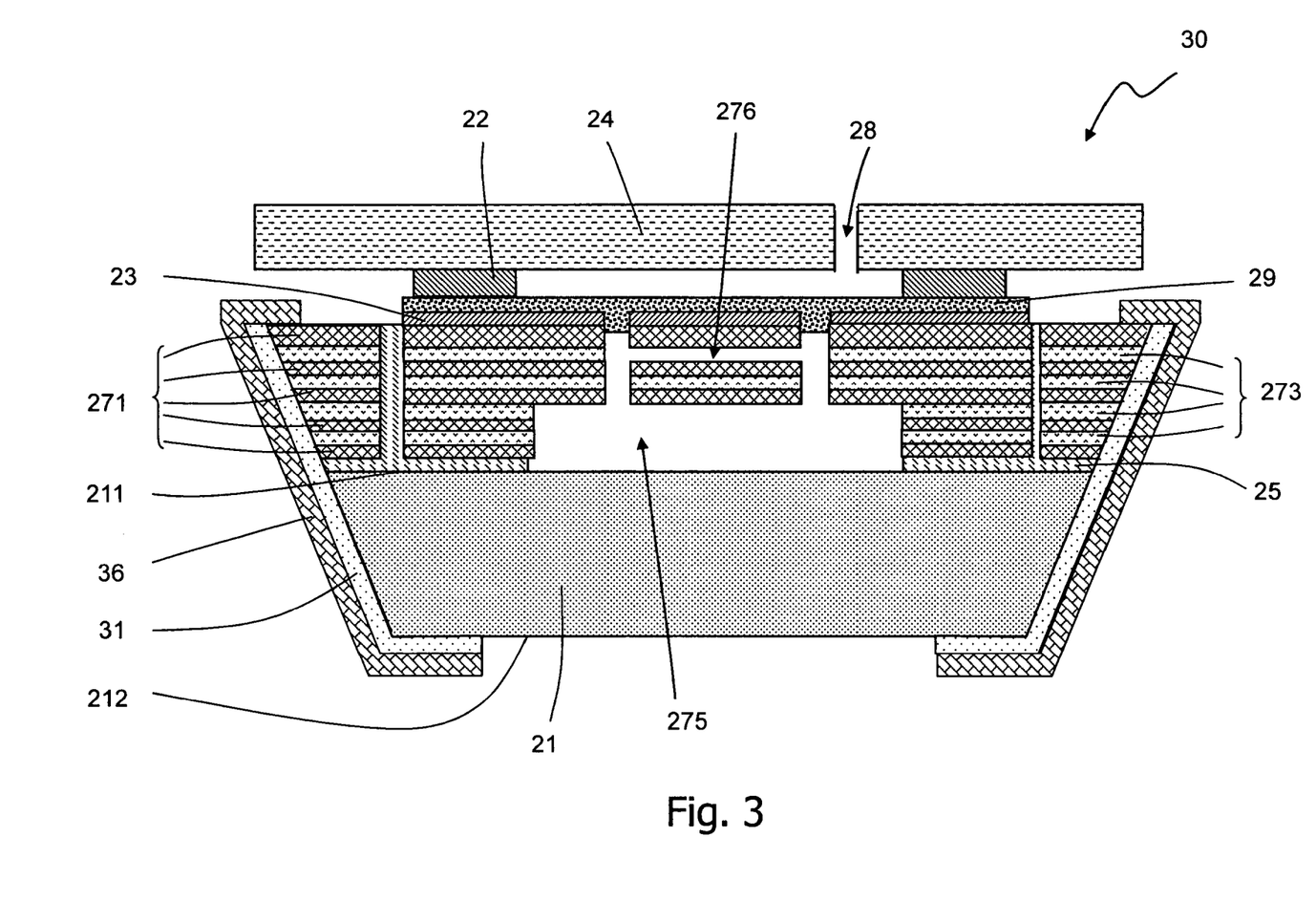
FIG. 3 shows a second embodiment of the present invention.

In addition to the TSVs, the present invention also can utilize T contacts to connect the MEMS device region 27; the T contacts also act as contacts for external connection. As shown in FIG. 3, in the MEMS 30, the T contacts 36 to connect the exposed topmost metal layer 271 of the MEMS device region 27. The leads of the T contacts 36 extend to the second surface 212 of the substrate 21. An insulating layer 31 is provided between the leads of the T contacts 36 and the MEMS device region 27 or the substrate 21 to insulate the T contacts 36 from the MEMS device region 27 and/or the substrate 21.

Figure 4:
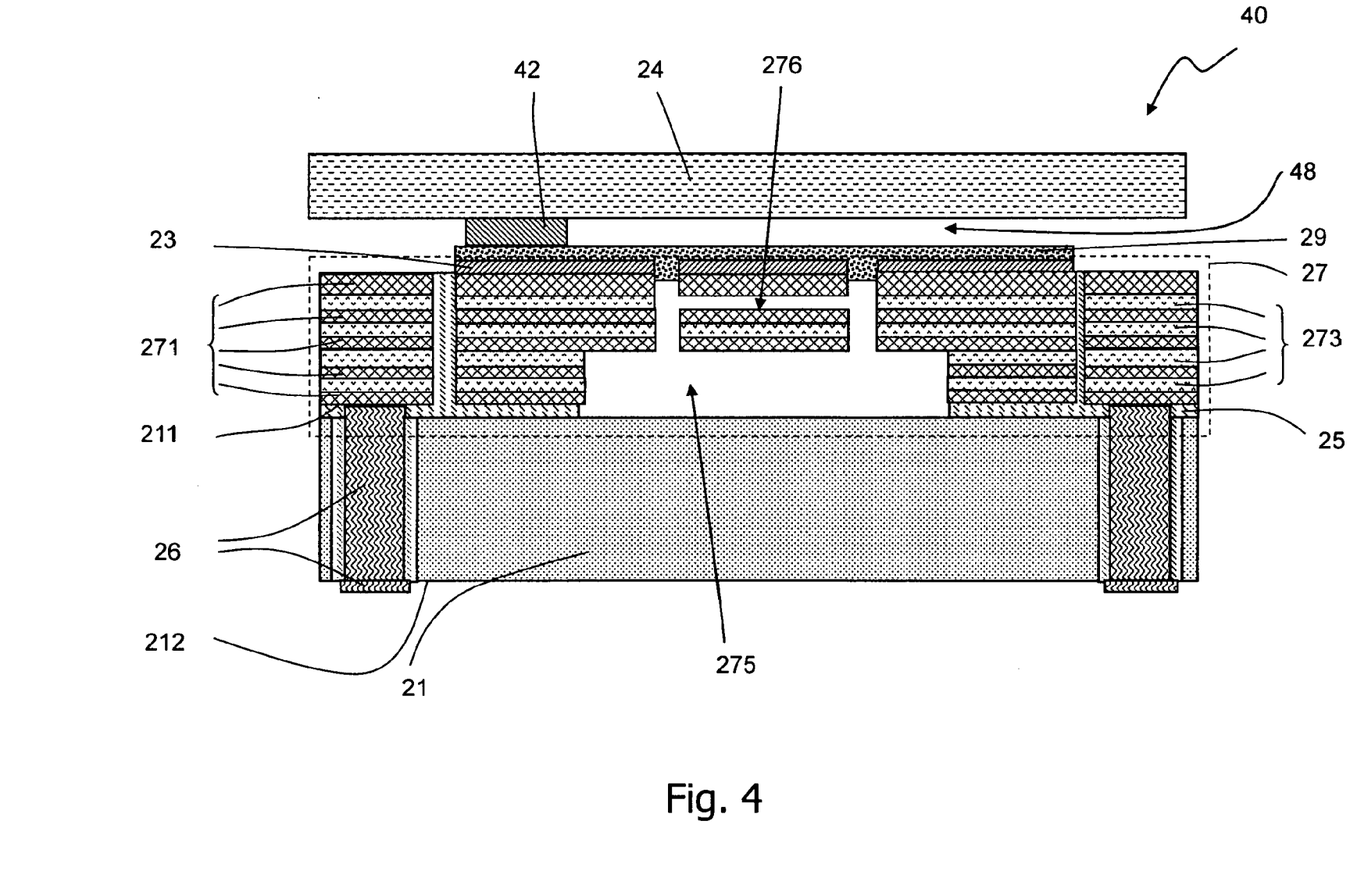
FIG. 4 shows a third embodiment of the present invention.

FIG. 4 shows another embodiment of the present invention. In comparison with the MEMS sensing device 10 in FIG. 2G, the cover 24 of the MEMS sensing device 40 in this embodiment does not have any openings, but the adhesive layer 42 coated on the film 29 has a non-closed pattern, i.e., the adhesive layer 42 does not form a sealed space. At least one opening 48 in the adhesive layer 42 allows the external air to pressure the film 29. Similar to the MEMS sensing device 30 in FIG. 3, the TSVs 26 in the MEMS sensing device 40 of this embodiment can be replaced by T contacts, to connect the MEMS device region 27 and provide contacts for external connection.

As described in the above, the present invention provides a MEMS sensing device and a method for making the MEMS sensing device, wherein a wafer level packaging process is integrated after a CMOS process, such that the manufacturing process provides high throughput. In contrast, the traditional QFN or LGA type MEMS devices need to be fabricated by complicated packaging processes and require multiple materials some of which are not commonly used in a typical CMOS semiconductor process. Hence, the present invention not only simplifies the manufacturing process, but also reduces the cost.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the major functions or performances of the MEMS device region can be added to the disclosed process or device. For another example, the MEMS device regions can be include other sensing devices instead of a variable capacitor, such as mass lumps. Thus, the present invention should cover all such and other modifications and variations, which should be interpreted to fall within the scope of the following claims and their equivalents.

What is claimed is:

1. A MEMS (Micro-Electro-Mechanical System) sensing device, comprising:
   a substrate having a first surface and a second surface opposite the first surface;
   a MEMS device region on the first surface of the substrate, the MEMS device region including a chamber and a multilayer structure;
   a mask layer covering the multilayer structure, the mask layer having at least one mask opening which exposes the chamber;
   a film overlaying on the mask layer to seal the at least one mask opening so that the chamber is sealed as a sealed space;
   an adhesive layer disposed on the film;
   at least one opening located on the adhesive layer whereby the adhesive layer does not form a sealed space;
   a cover mounted on the MEMS device region and adhered by the adhesive layer; and
   a plurality of leads electrically connected to the MEMS device region and extending to the second surface.

2. The MEMS sensing device of claim 1, wherein the MEMS device region includes a variable capacitor whose capacitance is changeable according to air pressure acting on the film.

3. The MEMS sensing device of claim 1, wherein the plurality of leads are a plurality of TSVs (Through Silicon Vias) through the substrate or a plurality of T shaped contacts.

4. The MEMS sensing device of claim 3, further comprising an insulating layer between the plurality of leads and the substrate or between the plurality of leads and the MEMS device region.

5. The MEMS sensing device of claim 1, wherein the film includes a metal layer.

6. The MEMS sensing device of claim 1, wherein the mask layer includes a metal layer, and wherein the MEMS device region includes wirings part of which are not covered by the film and the mask layer, and the plurality of leads are connected to the wirings part of which are not covered by the film and the mask layer.

7. The MEMS sensing device of claim 1, wherein the MEMS sensing device is a pressure sensor.

8. The MEMS sensing device of claim 1, wherein the at least opening located on the adhesive layer allows external air outside the MEMS sensing device to pressure the film.

* * * * *